US010290507B2

(12) United States Patent
Black et al.

(10) Patent No.: US 10,290,507 B2
(45) Date of Patent: *May 14, 2019

(54) FORMATION OF ANTIREFLECTIVE SURFACES

(71) Applicant: Brookhaven Science Associates, LLC, Upton, NY (US)

(72) Inventors: Charles T. Black, New York, NY (US); Atikur Rahman, Ridge, NY (US); Matthew Eisaman, Port Jefferson, NY (US); Ahsan Ashraf, Port Jefferson, NY (US)

(73) Assignee: BROOKHAVEN SCIENCE ASSOCIATES, LLC, Upton, NY (US)

( * ) Notice: Subject to any disclaimer, the term of this patent is extended or adjusted under 35 U.S.C. 154(b) by 260 days.

This patent is subject to a terminal disclaimer.

(21) Appl. No.: 14/897,481

(22) PCT Filed: Jun. 13, 2014

(86) PCT No.: PCT/US2014/042400
§ 371 (c)(1),
(2) Date: Dec. 10, 2015

(87) PCT Pub. No.: WO2015/053828
PCT Pub. Date: Apr. 16, 2015

(65) Prior Publication Data
US 2016/0139302 A1 May 19, 2016

Related U.S. Application Data

(60) Provisional application No. 61/835,574, filed on Jun. 15, 2013, provisional application No. 61/893,072, filed on Oct. 18, 2013.

(51) Int. Cl.
H01L 21/308 (2006.01)
G02B 1/118 (2015.01)
(Continued)

(52) U.S. Cl.
CPC .......... *H01L 21/3086* (2013.01); *G02B 1/118* (2013.01); *G03F 7/0002* (2013.01);
(Continued)

(58) Field of Classification Search
None
See application file for complete search history.

(56) References Cited

U.S. PATENT DOCUMENTS 8,741,158 B2 6/2014 Aytug et al.
9,120,669 B2 9/2015 Choi et al.
(Continued)

OTHER PUBLICATIONS

Y. Tseng et al., The Journal of Physical Chemistry C, vol. 115, pp. 17725-17729 (Year: 2011).*
(Continued)

Primary Examiner — Jiong-Ping Lu

(57) ABSTRACT

Technologies are described for methods and systems effective for etching nanostructures in a substrate. The methods may comprise depositing a patterned block copolymer on the substrate. The patterned block copolymer may include first and second polymer block domains. The methods may comprise applying a precursor to the patterned block copolymer to generate an infiltrated block copolymer. The precursor may infiltrate into the first polymer block domain and generate a material in the first polymer block domain. The methods may comprise applying a removal agent to the infiltrated block copolymer to generate a patterned material. The removal agent may be effective to remove the first and second polymer block domains from the substrate. The methods may comprise etching the substrate. The patterned material on the substrate may mask the substrate to pattern the etching. The etching may be performed under conditions to produce nanostructures in the substrate.

17 Claims, 4 Drawing Sheets

(51) Int. Cl.
G03F 7/40 (2006.01)
H01L 21/033 (2006.01)
G03F 7/00 (2006.01)
H01L 21/027 (2006.01)
H01L 21/3065 (2006.01)

(52) U.S. Cl.
CPC .......... *G03F 7/405* (2013.01); *H01L 21/0271* (2013.01); *H01L 21/0273* (2013.01); *H01L 21/0337* (2013.01); *H01L 21/3065* (2013.01); *B81C 2201/0149* (2013.01); *H01J 2237/334* (2013.01)

(56) References Cited

U.S. PATENT DOCUMENTS

| 9,169,566 | B2 | 10/2015 | Morhard et al. | |
|---|---|---|---|---|
| 9,207,363 | B2 | 12/2015 | Stoia et al. | |
| 9,469,526 | B2 | 10/2016 | Morhard et al. | |
| 2010/0090230 | A1* | 4/2010 | Honma | B82Y 20/00 257/89 |
| 2010/0216311 | A1 | 8/2010 | Tamaki | |
| 2012/0052241 | A1* | 3/2012 | King | B08B 17/06 428/141 |
| 2012/0241411 | A1* | 9/2012 | Darling | G03F 7/405 216/67 |

OTHER PUBLICATIONS

Raut, H. K., et al., "Anti-reflective coatings: A critical, in-depth review", Energy Environ. Sci., (2011) vol. 4, 3779-3804.
Park, M., et al., "Block Copolymer Lithography: Periodic Arrays of ~10^11 Holes in 1 Square Centimeter", Science, vol. 276, 1401-04 (1997).
Kuo, C.-W., et al., "Fabrication of Size-Tunable Large-Area Periodic Silicon Nanopillar Arrays with Sub-10-nm Resolution", J. Phys. Chem. B (2003) vol. 107, pp. 9950-9953.
Peng, Q., et al., "A Route to Nanoscopic Materials via Sequential Infiltration Synthesis on Block Copolymer Templates", ACS Nano, vol. 5, No. 6, (2011) pp. 4600-4606.
Samukawa, S., "Ultimate Top-down Etching Processes for Future Nanoscale Devices: Advanced Neutral-Beam Etching", Japanese Journal of Applied Physics, vol. 45, No. 4A (2006) pp. 2395-2407.
Wang, M., et al., "High energy electron fluxes in dc-augmented capacitively coupled plasmas. II. Effects on twisting in high aspect ratio etching of dielectrics", J. of Applied Physics, vol. 107, (2010) pp. 023309-1 to 023309-11.
Bouchoule, S., et al., "Effect of Cl2- and HBr-based inductively coupled plasma etching on InP surface composition analyzed using in situ x-ray photoelectron spectroscopy", J. Vac. Sci. Technol. A vol. 30, No. 3 (2012) pp. 031301-1-031301-11.
Toma, M., "Fabrication of Broadband Antireflective Plasmonic Gold Nanocone Arrays on Flexible Polymer Films", Nano Lett. (2013) vol. 13, pp. 6164-6169.

* cited by examiner

FORMATION OF ANTIREFLECTIVE SURFACES

CROSS REFERENCE TO RELATED APPLICATIONS

This application claims priority to provisional application No. 61/835,574, filed Jun. 15, 2013, entitled "High Density Nanocone/Nanopillar Arrays for Highly Antireflective Surfaces", and provisional application 61/893,072, filed Oct. 18, 2013, entitled "Nanostructured Surfaces", the entirety of both of these applications is hereby incorporated by reference in their entirety.

STATEMENT OF GOVERNMENT RIGHTS

The present application was made with government support under contract number DE-AC02-98CH10886 awarded by the U.S. Department of Energy. The United States government has certain rights in the invention(s).

FIELD OF THE INVENTION

This disclosure relates generally to antireflective structures and the formation of antireflective surfaces exhibiting antireflective or absorbing properties to a range of electromagnetic wavelengths.

BACKGROUND

Waves, such as electromagnetic, acoustic, or water waves propagate energy through a medium. When a wave travels from one medium to another, the wave may partially or totally reflect due to the impedance mismatch between the two media. Several antireflection coating schemes have been developed including single and layered dielectric coatings, surface texturing, and use of plasmonic nanoparticles.

SUMMARY

In some examples, methods for etching nanostructures in a substrate are generally described. The methods may comprise depositing a patterned block copolymer on the substrate. The patterned block copolymer may include a first polymer block domain and a second polymer block domain. The methods may comprise applying a precursor to the patterned block copolymer on the substrate to generate an infiltrated block copolymer on the substrate. The precursor may infiltrate into the first polymer block domain and generate a material in the first polymer block domain. The precursor may not infiltrate into the second polymer block domain. The methods may comprise applying a removal agent to the infiltrated block copolymer on the substrate to generate a patterned material on the substrate. The removal agent may be effective to remove the first polymer block domain and the second polymer block domain from the substrate. The removal agent may not be effective to remove the material in the first polymer block domain. The methods may comprise etching the substrate. The patterned material on the substrate may mask the substrate to pattern the etching. The etching may be performed under conditions sufficient to produce nanostructures in the substrate.

In some examples, a nanotexture in a substrate is generally described. The nanotexture may comprise pillars in the substrate. Each pillar may have a top, a base and a pillar center. Each pillar may have a substantially circular top cross-section and a base width of about 5 nm to about 100 nm. The pillars may be patterned in an array with distances of about 5 nm to about 100 nm between adjacent pillar centers.

In some examples, a nanotexture in a substrate is generally described. The nanotexture may comprise pillars in the substrate. Each pillar may have a top, a base and a pillar center. Each pillar may have a substantially circular top cross-section and a base width of about 5 nm to about 100 nm. The pillars may be patterned in an array with distances of about 5 nm to about 100 nm between adjacent pillar centers. The nanostructures may include a metal oxide dot on the tip of each nanostructure.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
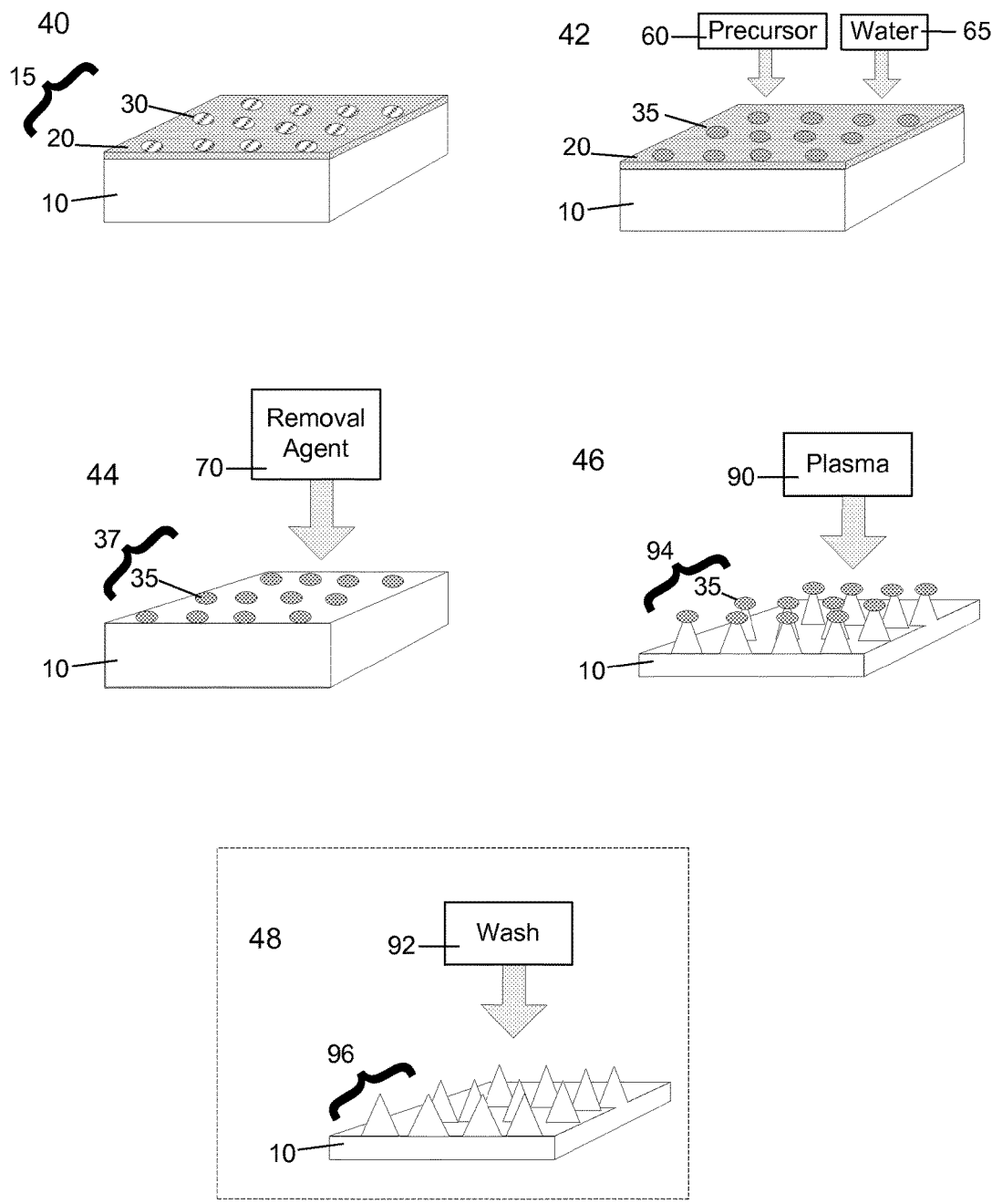
FIG. 1 illustrates an example of a system that can be utilized to form antireflective surfaces.

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

As used herein, any compound, material or substance which is expressly or implicitly disclosed in the specification and/or recited in a claim as belonging to a group or structurally, compositionally and/or functionally related compounds, materials or substances, includes individual representatives of the group and all combinations thereof.

FIG. 1 illustrates an example system 100 that can be utilized to form antireflective surfaces, arranged in accordance with at least some embodiments presented herein. As discussed in more detail below, a substrate may be processed to form an antireflective surface.

System 100 may include a substrate 10 and a block copolymer 15. Block copolymer 15 may be deposited on a substrate 10. Substrate 10 may be any substrate for which antireflectivity is desired such as various types of polymers (e.g., polyimide), silicon nitride, glass, or silicon. Block copolymer 15 may be a diblock copolymer, triblock or other multiblock copolymer. Block copolymer 15 may be a diblock copolymer and may include two polymer domains comprised of polymer blocks 20 and 30. Polymer blocks 20 and 30 may be immiscible and may be bound together by covalent bonds. As shown at 40 in FIG. 1, block copolymer 15 may include a patterning of the first domain defined by polymer blocks 20 and a second domain defined by polymer blocks 30. The pattern may be defined by a placement of polymer block 20 and polymer block 30 within block copolymer 15. The pattern may be formed in block copolymer 15 as block copolymer 15 phase-separates to minimize available free energy. Nanostructure patterns and dimensions of polymer blocks 20 and 30 may be adjusted by adjusting molecular weight ratio between polymer block 20 and polymer block 30.

Polymer blocks 20 and 30 in block copolymer 15 may each include respective characteristics and properties. The characteristics and properties of polymer block 20 may be different from the characteristics and properties of polymer block 30. For example, properties of polymer block 30 may include an affinity to a particular substance and properties of polymer block 20 may not include an affinity to the particular substance. Differences in characteristics and properties of polymer block 20 from polymer block 30 may allow block copolymer 15 to be used to generate a pattern on substrate 10.

Block copolymer 15 may be deposited on substrate 10 by spin coating/casting, blade coating, or continuous roll-to-roll processing. For example, a diblock polymer may be dissolved in a solvent and applied to substrate 10. The diblock polymer may be spin coated on substrate 10 to form a 20-50 nm thick layer and then heated in an oven at about 100-240° C. from about 30 minutes to 24 hours to generate block copolymer 15. Block copolymer 15 may, for example, be polystyrene-block-polyethelyneoxide (PS:PEO), polystyrene-block-poly(methylmethacrylate) (PS:PMMA) or any other block copolymer. PS:PMMA may be asymmetric material with molecular weights ranging between 40 kg/mol and 200 kg/mol and molecular weight ratio of 70:30 PS:PMMA. The pattern of block copolymer 15, which is defined by the placement of polymer blocks 20 and polymer blocks 30, may be for example, cylindrical. A cylindrical pattern of block copolymer 15 may include hexagonally arranged features with separations between about 25 nm and 100 nm. For example, when block copolymer 15 is PS:PMMA, hexagonally close packed PMMA domains may be in a matrix of PS. PMMA as polymer block 30 and PS as polymer block 20 is illustrated at 40.

As shown at 42, block copolymer 15 may be chemically transformed into a material such as an inorganic template by selectively infiltrating one of polymer blocks 20, 30 with a precursor 60. Precursor 60 may be a metal organic precursor such as tri-methyl aluminum (TMA). Polymer blocks 20 and 30 in block copolymer 15, and precursor 60, may be selected to control features of the inorganic template as desired. For example, the size and spacing between polymer blocks 20, 30 may be selected, and the polymer block 20, 30 which may be infiltrated by precursor 60 may be selected to control features of the inorganic template. For example, precursor 60 and polymer blocks 20 30, may be selected so that precursor 60 infiltrates polymer block 30 and precursor 60 may not infiltrate polymer block 20.

Water 65 may be applied to the block copolymer after infiltration by precursor 60. Water 65 may react with precursor 60, infiltrated in one of polymer block 20 or 30, to form a material such as metal oxide 35. For example, when precursor 60 is TMA, TMA may infiltrate in polymer block 30, in examples where polymer block 30 is PMMA. TMA infiltrated in polymer block 30 may react with water 65 and oxidize, forming metal oxide 35, such as forming aluminum oxide ($Al_2O_3$). Metal oxide 35 formed by precursor 60 infiltrated into polymer block 30 and reacted with water 65 may be patterned and in the shape of polymer block 30. Metal oxide 35 may be more robust that block copolymer 15 and polymer blocks 20, 30. Metal oxide 35 may form a more robust template or mask that may be used for etching a nanostructure in substrate 10 to form an antireflective surface.

Figure 2:
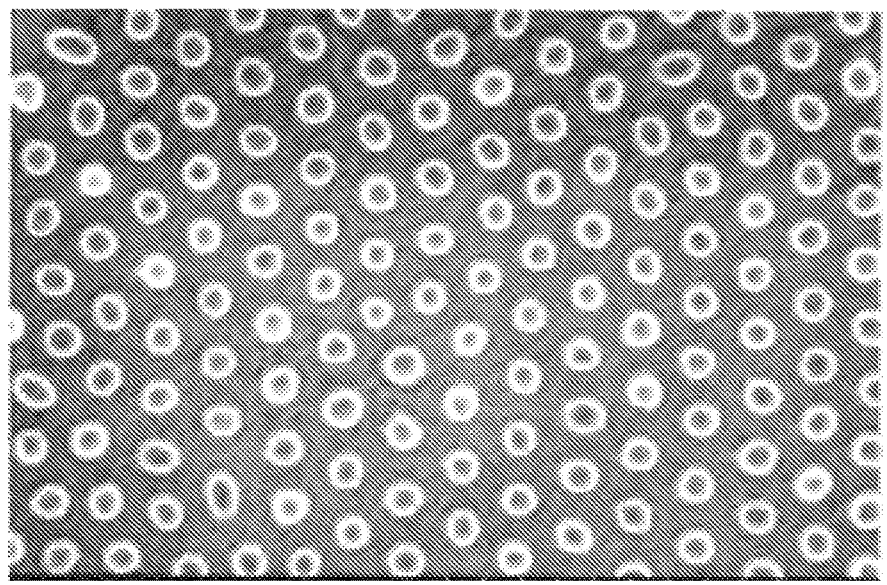
FIG. 2 is a top view SEM (scanning electron microscope) image of aluminum oxide dots on a silicon substrate.

Metal oxide 35 may form the inorganic template on substrate 10. As shown at 44, a removal agent 70 may be applied to substrate 10 to remove polymer blocks 20 and 30 from substrate 10, leaving metal oxide dots 35 and thereby defining an inorganic template 37. Polymer blocks 20, 30, that are not infused with precursor 60, may be organic materials and may be removed from substrate 10 by removal agent 70. Removal agent 70 may be oxygen plasma or heating in the presence of oxygen to an appropriate temperature (e.g., between 400-500 C) and may remove organic materials, including polymer blocks 20, 30, from substrate 10. Inorganic template 37, patterned by polymer block 30, may be left on substrate 10 after applying removal agent 70. Metal oxide dots 35 may form a quasi-ordered array of uniform metal oxide dots with size and spacing determined by placement of polymer blocks 20, 30 in block copolymer 15. For example, alumina metal oxide 35 formed from polymer block of 15 PS:PMMA and precursor 60 of TMA may form inorganic template 37 with hexagonally arranged features with centers between 5 nm and 100 nm, or more particularly between 30 nm and 60 nm. FIG. 2 displays a top view SEM image of aluminum oxide dots formed within PMMA domains on a silicon substrate.

As shown at 46, plasma 90 may be applied to substrate 10 with metal oxide template 37, to etch nanostructures 80 in substrate 10. Plasma 90 may produce a nanotextured substrate by etching a portion of substrate 10 exposed by metal oxide template 37. Plasma 90 may etch substrate 10 exposed by metal oxide template 37 and plasma 90 may not etch substrate masked by metal oxide template 37. Plasma 90 may etch substrate 10 such as to form nanostructures 80 in substrate 10. Nanostructures 80 etched in substrate 10 may be patterned by metal oxide template 37. Metal oxide template 37 may pattern the etching of nanostructures 80. For example, if metal oxide template 37 is metal oxide dots 35 patterned in an array, plasma 90 may etch nanostructures 80 in substrate 10 patterned in an array. Plasma conditions and etch time may be adjusted to control the height (e.g. a depth that the plasma etches into substrate 10) and the profile of nanostructures 80 left in substrate 10 as well as modifications of the optical constants of the nanotexture material after etching. For example, plasma 90 may produce nanostructures 80 in arrays such as pillars with a conical profile as illustrated at 46. A distance between centers of pillars may be between 5 nm and 100 nm, or more particularly between 30 nm and 60 nm.

The etching process may change the optical properties, such as the refractive index and extinction coefficient, of different aspects of the nanotexture, for example a surface layer of the nanotexture or an interior of the nanotexture. The etching process may alter the refractive index and extinction coefficient of just the surface layer of the material comprising the nanotexture as compared to the optical properties of the material in the nanotexture interior. As an example, a surface layer of between 1-10 nm thickness may be modified to have a refractive index that is lower than the refractive index of the interior, and an extinction coefficient that is higher than the extinction coefficient of the interior. Thus the complex refractive index profile of the nanotexture may be controlled by either the geometry of the etched surface, or modifications of the optical constants or both.

A resultant surface that includes substrate 10 and the formed nanostructures 80 may be spiky, rough or both and may define a nanotexture. Nanostructures 80 etched in substrate 10 may be, for example, pillars such as conical nanotextures. An aspect ratio of the formed conical nanotextures may be about 1:1 (height to average width ratio) to about 20:1 (height to average width ratio). The bases of the formed conical nanotextures may be in contact so as all of substrate 10 is nanotextured. The present nanostructures may be sufficiently small such that the nanostructures are antireflective. Thus, resultant surfaces that include the above mentioned nanostructures 80 may display antireflective properties. As used herein antireflective properties may refer to a majority of light incident to the present nanostructures that may be transmitted into the nanostructure. When the shape and spacing of nanotextures are shorter than the wavelengths of electromagnetic waves of light, the textured nanosurface may act to gradually vary the index of refraction value from that of air at the air interface to that of the substrate 10 at the base of the nanotextures. Accordingly, present nanostructures may possess antireflectivity for wavelengths of light that are greater than about twice the separation distance between pillars of the nanotextures (e.g., for a 50 nm distance between pillar centers, antireflectivity for wavelengths of light greater than about 100 nm). The antireflective properties may also further mimic the omni-directional broad band antireflectivity of moth compound eyes. Further still, the antireflective properties of the present nanotextures may be simultaneous with superhydrophobic properties.

Conical nanotextures may be etched in substrate 10 when plasma 90 is a combination of gases that etch substrate 10 slightly isotropically, etching down vertically and laterally to form conical nanotextures. Plasma 90 may etch substrate 10 under metal oxide dots 35. Plasma 90 may be 50-50-10 chlorine, oxygen, hydrogen bromine (HBr) and may form conical nanotextures at room temperature (between about 20° C. and 30° C.). Other plasma gases are possible, including, for example sulfur hexafluoride, $CHF_4$, $CF_4$, $CF_3Br$. Conical nanotextures dimensions may be adjusted by adjusting etch time, plasma pressure and the power of radio frequency of plasma 90. Etch time may range from 1 to 10 seconds and power of radio frequency of plasma may range from 10 to 100 watts. Longer etch times may form sharper nanotextures and may result in metal oxide dots 35 falling off of nanotexture tips as the tips of the nanotextures diminish in size. The tip or point of etched nanotextures may have a curvature radius of about 5 nm. Nanotextures may be about 50 nm to about 400 nm high, about 30 to about 60 nm wide at the base and about 5 nm to about 20 nm wide at the tip.

In one example, nanotextured surface 94 is produced after etching by plasma 90. Nanotextured surface 94 may include densely packed nanotexture arrays where the width of the nanotextures tapers gradually from largest width at the bottom near substrate 10, to the smallest width at the top with a metal oxide dot on the tip of each cone. The array of metal oxide tipped nanotextures may substantially eliminate sharp changes in refractive index when light travels from the air to substrate 10, and may result in greatly reduced reflection at the air/substrate interface. The substantial elimination of sharp changes in refractive index may be due to a difference in refractive index between the metal oxide dot and the material of the nanotexture and substrate, as well as the gradual tapering of the nanotextures. The profile of the nanotexture can be entirely vertical, producing a cylindrical nanotexture, or it may vary linearly with etch depth, resulting in a conical shape. The nanotexture profile is determined by details of the plasma etch conditions, and may be tuned to more complex geometries such as hourglass shapes, depending on the application. When the shape and spacing of the nanotextures are shorter than the wavelengths of electromagnetic waves of light, the textured surface acts to gradually vary the index of refraction value from that of air at the air interface to that of the substrate 10 at the base of the nanotextures.

In another example, as is illustrated at 48, after plasma etching, a wash solution 92 may be applied to substrate 10 and metal oxide 35 to produce nanotextured surface 96. Metal oxide 35 may be washed off of substrate 10 and etched nanotextures by wash solution 92. Wash solution 92 may be a dilute acid, for example, buffered hydrofluoric acid (50:1). Removal of metal oxide dots 35 by wash solution 92 may produce nanotextured surface 96. Nanotextured surface 96 may include densely packed nanotexture arrays where the width of the nanotextures tapers gradually from largest width at the bottom near bulk substrate 10 to the smallest width at the top. The gradual tapering of the nanotextures in nanotextured surface 96 may substantially eliminate sharp changes in refractive index when light travels from the air to substrate 10, and may result in greatly reduced reflection at the air/substrate interface. Further, the etching process may change the optical properties, such as the refractive index and extinction coefficient, of different aspects of the nanotexture, for example a surface layer of the nanotexture and an interior of the nanotexture. The etching process may alter the refractive index and extinction coefficient of just the surface layer of the material comprising the nanotexture as compared to the materials in the nanotexture interior For example, a surface layer of between 1-10 nm may be modified to have reduced refractive index and increased extinction coefficient. Thus the complex refractive index profile may be controlled through either the geometry of the nanotextured surface or through modification of the optical constants of the nanotexture material or both by varying the etch process conditions. The spacing of the nanotextures in nanotextured surface 96 may be shorter than the wavelengths of electromagnetic waves of light. The shape and spacing of the nanotextures in nanotextured surface 96 may be able to vary the index of refraction from the value of air at the air interface to the value of substrate 10 at the base of the nanotextures.

In an example, block copolymer 15 may be polystyrene-block-polymethylmethacrylate (PS:PMMA), with molecular weights ranging between about 40 kg/mol and about 200 kg/mol and a molecular weight ratio of about 70:30 PS:PMMA. PS:PMMA may be a cylindrical phase block copolymer, and may form patterns of hexagonally packed PMMA domains in a matrix of PS. Block copolymer 15 may form cylindrical patterns when deposited on a substrate 10, for example, silicon.

The pattern of block copolymer 15 may be converted to an inorganic template by selectively infiltrating the PMMA block with a metal organic precursor 60, such as tri-methyl aluminum, and reacting with water 65 to form aluminum oxide 35. An oxygen plasma may be used as removal agent 70 to remove the organic material such as the block copolymer. The substrate 10 may be silicon and may include a quasi-ordered array of uniform aluminum oxide dots 35 with size and spacing determined by the initial block copolymer. FIG. 2 is a top view SEM (scanning electron microscope) image of aluminum oxide dots 35 on a silicon substrate. The aluminum oxide dots 35 in an array pattern may form inorganic template 37.

Figure 3:
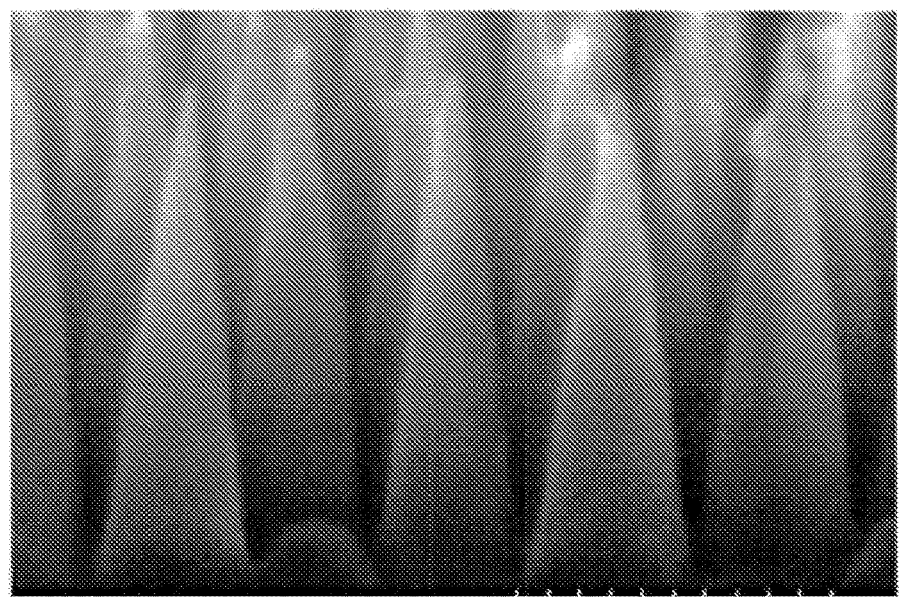
FIG. 3 is a side perspective SEM image of silicon cone arrays etched in a silicon substrate.
Figure 4:
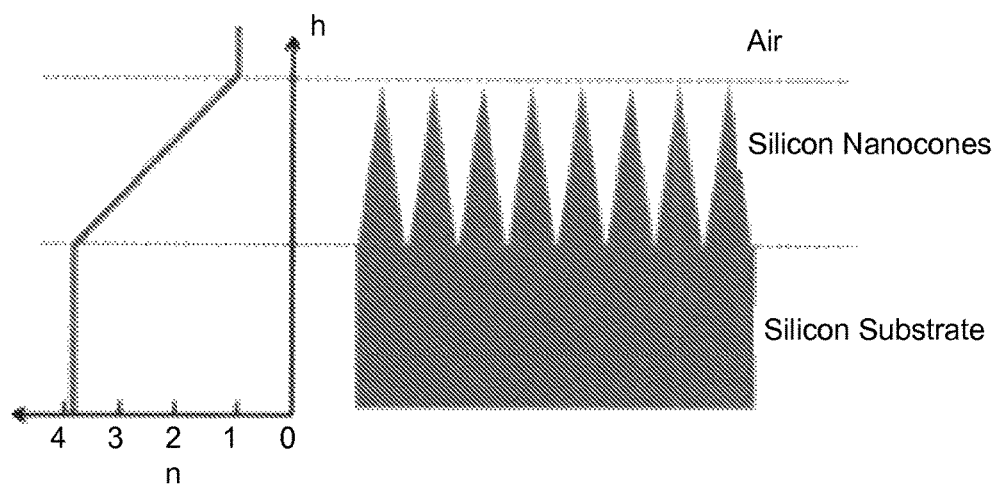
FIG. 4 is a chart illustrating a gradual variation of refractive index (n) as a function of height (h) from a silicon substrate to air when the silicon substrate includes silicon nanotexture.
Figure 5:
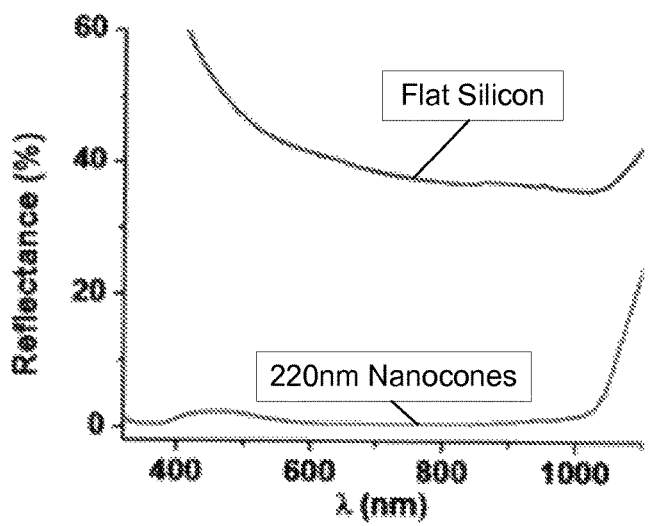
FIG. 5 is a chart illustrating reflectance as a function of wavelength of light for flat silicon and a silicon substrate with nanotextures of a height of 220 nm.

Inorganic template 37 may form a robust mask for etching of the underlying silicon substrate 10 by plasma 90. By adjusting the chemistry of plasma 90 as well as the etch time and conditions, it may be possible to control the pillar height and profile. For example, using plasma 90 with an HBr+$Cl_2$+$O_2$ etch chemistry, it may be possible to produce nanostructure arrays such as pillars with a conical profile (nanotextures). FIG. 3 is a SEM image of silicon cone arrays etched in a silicon substrate. FIG. 4 is a chart illustrating a gradual variation of refractive index (n) as a function of height (h) from a silicon substrate to air when the silicon substrate includes silicon nanotextures. A refractive index describes how light, or any other radiation, propagates through a medium. As the conical structure of the nanotextures increases in width gradually from air to substrate, the refractive index from air to silicon substrate increases with the increase in the fraction of silicon. The effective refractive index varies continuously from 1.0 (all air) to 3.8 (all silicon) as shown in FIG. 4, and reduces the reflection of incident light. The nanotextures may help match refractive index continuously from air to bulk silicon. FIG. 5 is a chart illustrating reflectance as a function of wavelength of light for flat silicon and a silicon substrate with nanotextures of a height of 220 nm. In an example, a ~220 nm silicon nanotexture height reduced the average reflectance of the silicon surface to ~1% over the wavelength range between about 350 to about 1000 nm, as compared to a flat silicon surface which showed an average of about 44% reflectance in this range.

Figure 6:
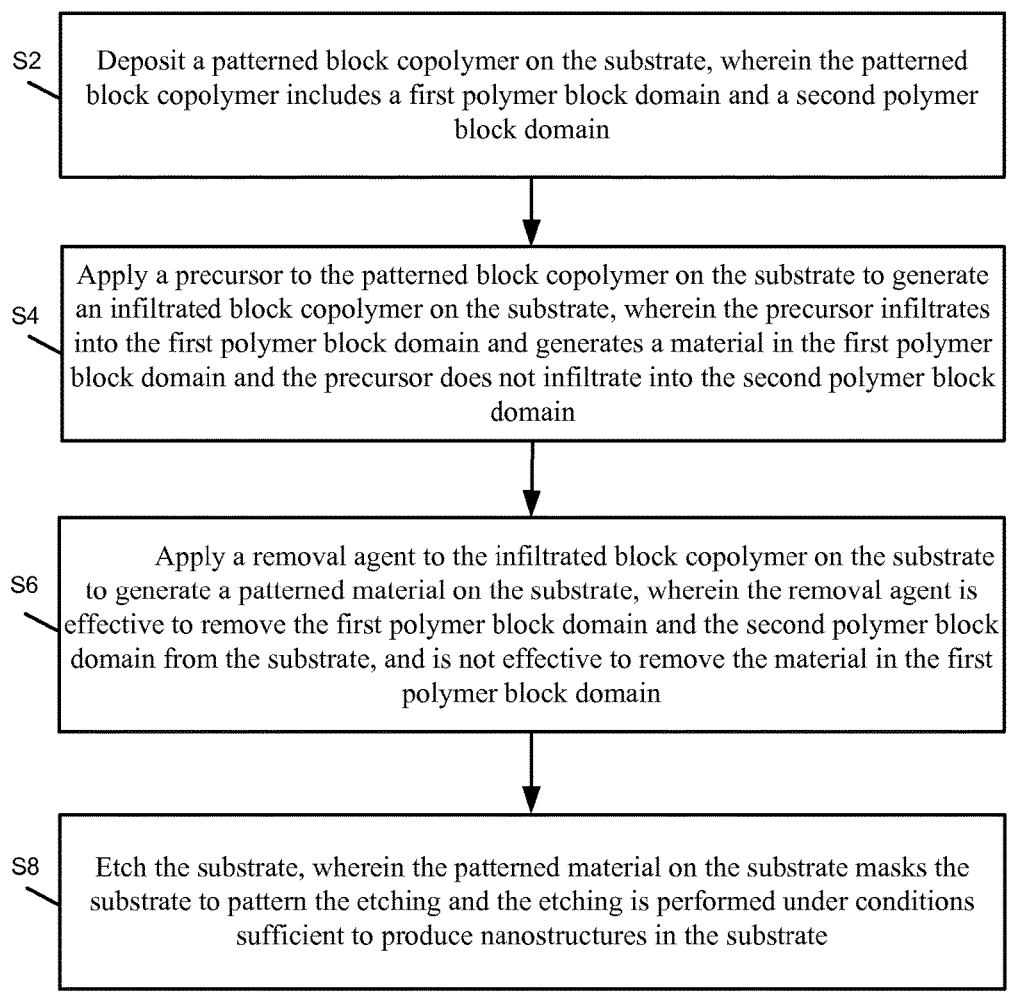
FIG. 6 illustrates a flow diagram of an example process for formation of antireflective surfaces.

FIG. 6 illustrates a flow diagram of an example process for of an example process for formation of antireflective surfaces, arranged in accordance with at least some embodiments presented herein. The process in FIG. 6 could be implemented using, for example, system 100 discussed above and may be used for formation of antireflective surfaces. An example process may include one or more operations, actions, or functions as illustrated by one or more of blocks S2, S4, S6, and/or S8. Although illustrated as discrete blocks, various blocks may be divided into additional blocks, combined into fewer blocks, or eliminated, depending on the desired implementation.

Processing may begin at block S2, "Deposit a patterned block copolymer on the substrate, wherein the patterned block copolymer includes a first polymer block domain and a second polymer block domain." At block S2, a patterned block copolymer is deposited on a substrate. The patterned block copolymer may include a first polymer block and a second polymer block. The first polymer block and the second polymer block may each include respective characteristics and properties which may be used for patterning. The block copolymer may be deposited on the substrate by spin coating/casting, blade coating, or continuous roll-to-roll processing. The block copolymer may be polystyrene-block-polyethelyneoxide (PS:PEO), polystyrene-block-poly(methylmethacrylate) (PS:PMMA) or any other block copolymer. The pattern of the block copolymer may be cylindrical. A cylindrical pattern may include hexagonally arranged features with separations between 30 nm and 60 nm.

Processing may continue from block S2 to block S4, "Apply a precursor to the patterned block copolymer on the substrate to generate an infiltrated block copolymer on the substrate, wherein the precursor infiltrates into the first polymer block domain and generates a material in the first polymer block domain and the precursor does not infiltrate into the second polymer block domain." At block S4, a precursor may be applied to the patterned block copolymer. The precursor may infiltrate into the first polymer block domain and generate a material in the first polymer block domain. The precursor may not infiltrate into the second polymer block domain. The precursor may be a metal organic precursor such as tri-methyl aluminum (TMA). Water may react with the precursor, infiltrated in the first polymer block to form a material such as a metal oxide. For example, when the precursor is TMA, TMA may infiltrate in the first polymer block, in examples where the first polymer block is PMMA. TMA infiltrated in the PMMA polymer block may react with water and oxidize, forming a metal oxide, aluminum oxide ($Al_2O_3$). The metal oxide may be patterned and in the shape of the PMMA polymer block. The metal oxide may form a more robust template or mask that may be used for etching a nanostructure in the substrate to form an antireflective surface.

Processing may continue from block S4 to block S6, "Apply a removal agent to the infiltrated block copolymer on the substrate to generate a patterned material on the substrate, wherein the removal agent is effective to remove the first polymer block domain and the second polymer block domain from the substrate, and is not effective to remove the material in the first polymer block domain." At block S6, a removal agent may be applied to the infused block copolymer to generate a patterned material on the substrate. The removal agent may be effective to remove the first and second polymer block domains. The removal agent may not be effective to remove the material in the first polymer block domain. The removal agent may be an oxygen plasma and may remove organic materials, including the first and second polymer blocks from the substrate. An inorganic template may be left on the substrate after applying the removal agent. The metal oxide may form a quasi-ordered array of uniform metal oxide dots with size and spacing determined by placement of the first polymer block. For example, $Al_2O_3$ metal oxide formed from PS:PMMA block copolymer and TMA precursor form an inorganic template with hexagonally arranged features with separations between 30 nm and 60 nm.

Processing may continue from block S6 to block S8, "Etch the substrate, wherein the patterned material on the substrate masks the substrate to pattern the etching and the etching is performed under conditions sufficient to produce nanostructures in the substrate." At block S8, the substrate may be etched. The patterned material on the substrate may mask the substrate to pattern the etching. The etching may be performed under conditions to produce nanostructures in the substrate. The etching may be done by plasma. The plasma may be applied to the substrate with the metal oxide template, to etch the substrate and result in the formation of nanostructures in the substrate. The plasma may produce a nanotextured substrate by etching a portion of the substrate exposed by the metal oxide template. The nanostructures etched in the substrate may be patterned by the metal oxide template. Plasma chemistry and etch time and conditions may be adjusted and may control height (e.g. a depth that the plasma etches into the substrate) as well as the profile of the nanostructures left in the substrate after etching. For example, the plasma may produce nanostructures in arrays with conical profiles. An aspect ratio of the formed nanostructures may be about 1:1 (height to average width ratio) to about 20:1 (height to average width ratio). In an example, the plasma may be 50-50-10 chlorine, oxygen, hydrogen bromine (HBr) and may form conical nanotextures at room temperature. Nanotextures may be about 50 nm to about 400 nm high, about 30 to about 60 nm wide at the base and about 5 nm to about 20 nm wide at the tip.

Among other possible benefits, a system in accordance with the present disclosure may reduce the reflection of solar light over a broad wavelength range and improve the performance of photovoltaics. The formed nanotextured surfaces may be used for the production of thin film based solar cells and may reduce the amount of active material needed. The fabrication process may be low-cost and performed by large area manufacturing. Control over shape and size may also allow the material's optical properties to be tailored. A system in accordance with the present disclosure may produce surfaces with a nanostructure that is patterned to mimic anti-reflection characteristics found in nature. For example, a so-called "moth-eye" structure, named after the anti-reflection nature of nocturnal insects, such as moths, refers to an anti-reflection surface that can maintain its anti-reflection property for a wide spectral range. A moth's compound eye is covered with about 2-400 nm sized features, smaller than the wavelength of visible light, and as a result exhibits near zero reflectance characteristics. The effective refractive index on the patterned surface varies gradually, and consequently the reflection of light on the patterned surface is drastically suppressed. The present surfaces may include structures at sizes that not only mimic the geometry of for example the moth-eye structure but has the additional benefit of chemical changes in the material that may take place within a few nanometers of the surface.

Minimization of reflection and maximization of optical pathlength may be beneficial for all photovoltaic materials, including single crystal silicon, poly-crystalline silicon, amorphous silicon, germanium, gallium arsenide, group III-V semiconductors, group II-VI semiconductors, copper-indium-gallium-selenide (CIGS), copper-zinc-tin-sulfide (CZTS), nanocrystal materials, and organic semiconductors. It is also beneficial in materials such as glass and transparent plastics.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for etching nanostructures in a substrate, the method comprising:
   depositing a patterned block copolymer on the substrate, wherein the patterned block copolymer includes a first polymer block domain and a second polymer block domain;
   applying a precursor to the patterned block copolymer on the substrate to generate an infiltrated block copolymer on the substrate, wherein the precursor infiltrates into the first polymer block domain and generates a material of metal oxide dots in the first polymer block domain and the precursor does not infiltrate into the second polymer block domain;
   applying a removal agent to the infiltrated block copolymer on the substrate to generate a patterned material on the substrate, wherein the removal agent is effective to remove the first polymer block domain and the second polymer block domain from the substrate, and is not effective to remove the material in the first polymer block domain;
   plasma etching the substrate, wherein the patterned material on the substrate masks the substrate to pattern the etching;
   wherein the etching is performed under etch times sufficiently long enough for metal oxide dots to fall off as tips of etched nanostructures diminish in size and form an antireflective nanotextured surface of etched nanostructures having bases in contact with one another; and
   wherein the etched nanostructures are sharp and reduce an average reflectance to about 1% over a wavelength between about 350 to 1000 nm.

2. The method of claim 1, wherein the etched nanostructures include conical nanotextures having a width tapering gradually from a largest width at a bottom of each nanostructure near the substrate, to a smallest width at a top of a tip of each nanostructure.

3. The method of claim 1, wherein the etched nanostructures are patterned in an array with a distance between centers of adjacent nanostructures between about 5 nm to about 100 nm.

4. The method of claim 1, wherein the nanostructures are about 50 nm to about 400 nm high, about 30 to about 60 nm wide at the base and about 5 nm to about 20 nm wide at the tip.

5. The method of claim 1, wherein the substrate is a polymer, a polyimide, silicon nitride, glass, or silicon.

6. The method of claim 1, wherein the block copolymer is polystyrene-block-poly(methylmethacrylate) (PS:PMMA).

7. The method of claim 1, wherein the precursor is a metal organic precursor.

8. The method of claim 7, wherein the metal organic precursor is tri-methyl aluminum (TMA).

9. The method of claim 1, wherein the removal agent is oxygen plasma.

10. The method of claim 1, wherein the substrate is silicon, the plasma etching is with a plasma that is 50-50-10 chlorine, oxygen, hydrogen bromine (HBr) and the plasma etching is performed at room temperature.

11. The method of claim 1 further comprising removing the patterned material with a diluted acid.

12. A method for etching nanostructures in a glass substrate, the method comprising:
   depositing a patterned block copolymer on the glass substrate, wherein the patterned block copolymer includes a first polymer block domain and a second polymer block domain;
   applying a precursor to the patterned block copolymer on the glass substrate to generate an infiltrated block copolymer on the glass substrate, wherein the precursor infiltrates into the first polymer block domain and generates a material of metal oxide dots in the first polymer block domain and the precursor does not infiltrate into the second polymer block domain;

applying a removal agent of oxygen plasma to the infiltrated block copolymer on the substrate to generate a patterned material on the glass substrate, wherein the removal agent is effective to remove the first polymer block domain and the second polymer block domain from the glass substrate, and is not effective to remove the material in the first polymer block domain;

plasma etching the glass substrate, wherein the patterned material on the glass substrate masks the glass substrate to pattern the etching;

wherein etching is performed under etch times sufficiently long enough for metal oxide dots to fall off as tips of etched nanostructures diminish in size and form an antireflective nanotextured surface of etched nanostructures having bases in contact with one another;

wherein the etched nanostructures are sharp and have a height of about 50 nm to 400 nm, a width of about 30 nm to 60 nm at the bases and a width of about 5 nm to 20 nm at the tips to reduce an average reflectance to about 1% over a wavelength between about 350 to 1000 nm.

13. The method of claim 12, wherein the etched nanostructures are patterned in an array with a distance between centers of adjacent nanostructures between about 5 nm to about 100 nm.

14. The method of claim 12, wherein the block copolymer is polystyrene-block-poly(methylmethacrylate) (PS: PMMA).

15. The method of claim 12, wherein the precursor is a metal organic precursor.

16. The method of claim 15, wherein the metal organic precursor is tri-methyl aluminum (TMA).

17. The method of claim 12, further comprising removing the patterned material with a diluted acid.

* * * * *